(12) United States Patent  
Lee

(10) Patent No.: US 7,173,864 B2  
(45) Date of Patent: Feb. 6, 2007

(54) DATA LATCH CIRCUIT AND SEMICONDUCTOR DEVICE USING THE SAME

(75) Inventor: Geun-Il Lee, Yongin-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 70 days.

(21) Appl. No.: 11/131,095

(22) Filed: May 17, 2005

(65) Prior Publication Data

US 2006/0077727 A1 Apr. 13, 2006

(30) Foreign Application Priority Data

Oct. 7, 2004 (KR) .................. 10-2004-0080123

(51) Int. Cl.
*G11C 7/10* (2006.01)
(52) U.S. Cl. .................. 365/189.05; 365/193
(58) Field of Classification Search .......... 365/189.05, 365/193, 233, 233.5
See application file for complete search history.

(56) References Cited

U.S. PATENT DOCUMENTS 5,835,444 A * 11/1998 Kim et al. .................. 365/233
5,923,595 A 7/1999 Kim
6,484,231 B1 * 11/2002 Kim ........................... 711/105
6,504,767 B1 * 1/2003 Brown .................. 365/189.05
6,657,908 B2 12/2003 Yoon et al.

FOREIGN PATENT DOCUMENTS

| JP | 10-188553 | 7/1998 |
|---|---|---|
| JP | 1000-195259 | 7/2000 |
| JP | 2001-035154 | 2/2001 |

* cited by examiner

*Primary Examiner*—Vu A. Le
(74) *Attorney, Agent, or Firm*—Marshall, Gerstein & Borun LLP

(57) ABSTRACT

There is provided a data latch circuit that comprises a first buffer for buffering an input data signal in synchronization with an input strobe signal, a first latch unit for conducting a switching operation in response to the strobe signal and latching an output signal from the first buffer for a preset time, a second buffer for buffering an output signal from the first latch unit in synchronization with the strobe signal, and a second latch unit for performing a switching operation in response to the strobe signal and latching an output signal from the second buffer. Further, the present invention provides a semiconductor device using the data latch circuit.

28 Claims, 3 Drawing Sheets

DATA LATCH CIRCUIT AND SEMICONDUCTOR DEVICE USING THE SAME

BACKGROUND OF THE INVENTION

1. Field of the Invention

The present invention relates to a data latch circuit and a semiconductor device using the same; and, more particularly, to a data latch circuit and a semiconductor device using the same which is capable of improving the timing margin to latch output data in a DQ block when data is inputted and outputted to and from the semiconductor device and a write operation margin when input data is written in a memory cell.

2. Description of Related Art

As is well known, DRAM (Dynamic Random Access Memory) is a volatile memory device that stores data in each cell having a structure of one transistor and one capacitor where a data input/output operation as basic function of DRAM cell is done by an on/off of a word line of transistor coupled with its gate within each cell.

A conventional device for the data input/output is shown in FIG. 1. As shown in FIG. 1, in the conventional DRAM memory device, a memory cell region is comprised of a plurality of banks. And, a read operation of the data stored in each cell is made by transmitting the cell date amplified by input/output (IO) sense amplifiers through global input/output (IO) lines and then latching them through transfer gates, gate0, gate1, . . . , by their transfer to DQ blocks. Further, a write operation of data to each cell from the outside is done by transmitting external data to write drivers from the DQ blocks through the global IO lines and then storing them in each memory cell.

Herein, details of a process of transferring cell data to each DQ block and latching it by its own block will be explained in the following. That is, data stored in each cell are amplified by the IO sense amplifiers and then transferred to the transfer gates gate0, gate1, . . . , installed at a preceding part of the DQ blocks through the global IO lines. And, the transfer gates gate0, gate1, . . . , conduct an on/off operation by a certain pin strobe signal pin_strobe for transferring the data to the DC blocks.

In the above, the strobe signal strobe generally refers to a control signal used for transmission of data, which indicates a short pulse signal for synchronization of data transmission during a transmission and reception of data in a computer system. And, the pin strobe signal pin_strobe is of a type of the strobe signal and used for synchronization of data transmission to the DQ blocks through the global IO lines.

In FIG. 1, the transfer gates gate0, gate1, . . . , are enabled or disabled in response to the pin strobe signals pin_strobe, thus transferring the cell data to the DC blocks. In other words, if the pin strobe signal pin_strobe is low level, then the transfer gates gate0, gate1, . . . , are turned-on and thus the cell data is transferred to the DC blocks for its latch. In contrary, if the pin strobe signal pin_strobe is transited to a high level, the transfer gates gate0, gate1, . . . , are turned-off, allowing for no transfer of the cell data to the DQ blocks.

However, in the conventional semiconductor device, there occurs non-synchronization in the data transmission upon a high-speed operation, resulting in the output of incorrect data. That is, in case the semiconductor device is operated at high speed, there exists a phenomenon that arises a level transition of cell data to turn-on the transfer gates gate0, gate1, . . . , due to the enabling of the pin strobe signal pin_strobe that issues since a difference of skew and flight time of data that are transited every one clock period is large. For this reason, data to be transferred to the DQ blocks at the next clock period is transferred and latched thereto in the current period.

FIG. 2 is a waveform showing the problems mentioned above. As shown, in the conventional semiconductor device, there appears a phenomenon that an interval where the pin strobe signal is low level, indicating that the transfer gates gate0, gate1, . . . , are enabled, and an interval where cell data from the global IO lines is transited from a high level (or low level) to a low level (or high level) overlap each other. This shows the fact that incorrect data can be transferred to the DQ blocks.

On the other hand, in the above, although presented is an instance where the cell data is provided to the DQ blocks, such situation may occur an instance that external data is transmitted via the global IO lines and then stored in each memory cell by the write drivers. That is, in this case, there exists a problem in that incorrect data is written in cell data since there is non-synchronization for data transmission between a write strobe signal wt_strobe for operating the write drivers and input data.

SUMMARY OF THE INVENTION

It is, therefore, a primary object of the present invention to provide a data latch circuit and a semiconductor device using the same which is capable of improving a timing margin to latch output data in DQ block when data is inputted and outputted in and from the semiconductor device and a write operation margin when the input data is written in a memory cell.

In accordance with one aspect of the present invention, there is provided a data latch circuit comprising: a first buffer for buffering an input data signal in synchronization with an input strobe signal; a first latch unit for performing a switching operation in response to the strobe signal and latching an output signal from the first buffer for a preset time; a second buffer for buffering an output signal from the first latch unit in synchronization with the strobe signal; and a second latch unit for performing a switching operation in response to the strobe signal and latching an output signal from the second buffer for a preset time.

In accordance with another aspect of the present invention, there is provided a semiconductor device comprising: a plurality of memory cell banks with memory cells; a plurality of sense amplifier for amplifying data signal from the memory cells; and a plurality of data latch circuits for latching the data signal transmitted through global input and output lines, wherein each data latch circuit includes: a first buffer for buffering the data signal in synchronization with an input strobe signal; a first latch unit for carrying out a switching operation in response to the strobe signal and latching an output signal from the first buffer for a preset time; a second buffer for buffering an output signal from the first latch unit in synchronization with the strobe signal; and a second latch unit for conducting a switching operation in response to the strobe signal and latching an output signal from the second buffer.

In accordance with still another aspect of the present invention, there is provided a semiconductor device comprising: a plurality of cell banks with memory cells; a plurality of data latch circuits for latching data signal transmitted through global input and output lines from outside input ports; and a plurality of write drivers for writing the data signal from the data latch circuits in each of the memory cells, wherein each data latch circuit includes:

a first buffer for buffering the data signal in synchronization with an input strobe signal; a first latch unit for performing a switching operation in response to the strobe signal and latching an output signal from the first buffer for a preset time; a second buffer for buffering an output signal from the first latch unit in synchronization with the strobe signal; and a second latch unit for conducting a switching operation in response to the strobe signal and latching an output signal from the second buffer for a preset time.

In the data latch circuit and the semiconductor device in accordance with the present invention, it is preferable that the first buffer is a first inverter for inverting the input data signal to output an inverted data signal or data signal and the second buffer is a second inverter for inverting an output signal from the first latch unit to provide an inverted signal.

In the data latch circuit and the semiconductor device in accordance with the present invention, it is preferable that the input data signal is a data signal transmitted from a memory cell through a global input and output line.

In the data latch circuit and the semiconductor device in accordance with the present invention, it is preferable that the input data signal is a data signal transmitted from an outside data input port through a global input and output line.

In the data latch circuit and the semiconductor device in accordance with the present invention, it is preferable that when the first buffer is in an enabled state by the strobe signal, the second latch unit is in an enabled state and the first latch unit and the second buffer are in a disabled state.

In the data latch circuit and the semiconductor device in accordance with the present invention, it is preferable that when the first buffer is in a disabled state by the strobe signal, the second latch unit is in a disabled state and the first latch unit and the second buffer are in an enabled state.

In the data latch circuit and the semiconductor device in accordance with the present invention, it is preferable that the first buffer includes; a first pull-up element; a first pull-down element; a first switch for switching an operation of the first pull-up element in response to the strobe signal; and a second switch for switching an operation of the first pull-down element in response to the strobe signal.

In the data latch circuit and the semiconductor device in accordance with the present invention, it is preferable that the first latch unit includes; a third inverter for inverting a signal from the first buffer to output an inverted signal; and a fourth inverter for conducting a switching operation in response to the strobe signal and inverting a signal from an output port of the third inverter to establish a feedback of the inverted signal to an input port of the third inverter.

In the data latch circuit and the semiconductor device in accordance with the present invention, it is preferable that the fourth inverter includes; a second pull-up element; a second pull-down element; a third switch for switching an operation of the second pull-up element in response to the strobe signal; and a fourth switch for switching an operation of the second pull-down element in response to the strobe signal.

In the data latch circuit and the semiconductor device in accordance with the present invention, it is preferable that the second buffer includes; a third pull-up element; a third pull-down element; a fifth switch for switching an operation of the third pull-up element in response to the strobe signal; and a sixth switch for switching an operation of the third pull-down element in response to the strobe signal.

In the data latch circuit and the semiconductor device in accordance with the present invention, it is preferable that the second latch unit includes; a fifth inverter for inverting a signal from the second buffer to provide an inverted signal; and a sixth inverter for performing a switching operation in response to the strobe signal and inverting a signal from an output port of the fifth inverter to make a feedback of the inverted signal to an input port of the fifth inverter.

In the data latch circuit and the semiconductor device in accordance with the present invention, it is preferable that the sixth inverter includes; a fourth pull-up element; a fourth pull-down element; a seventh switch for switching an operation of the fourth pull-up element in response to the strobe signal; and an eighth switch for switching an operation of the fourth pull-down element in response to the strobe signal.

BRIEF DESCRIPTION OF THE DRAWINGS

The above and other objects and features of the instant invention will become apparent from the following description of preferred embodiments taken in conjunction with the accompanying drawings, in which.

DESCRIPTION OF THE PREFERRED EMBODIMENT

Hereinafter, preferred embodiments of the present invention will be explained in detail with reference to the accompanying drawings. First, it should be noted that since these embodiments are presented to illustrate the present invention merely, the right protection scope of the present invention is not limited to those embodiments.

Figure 1:
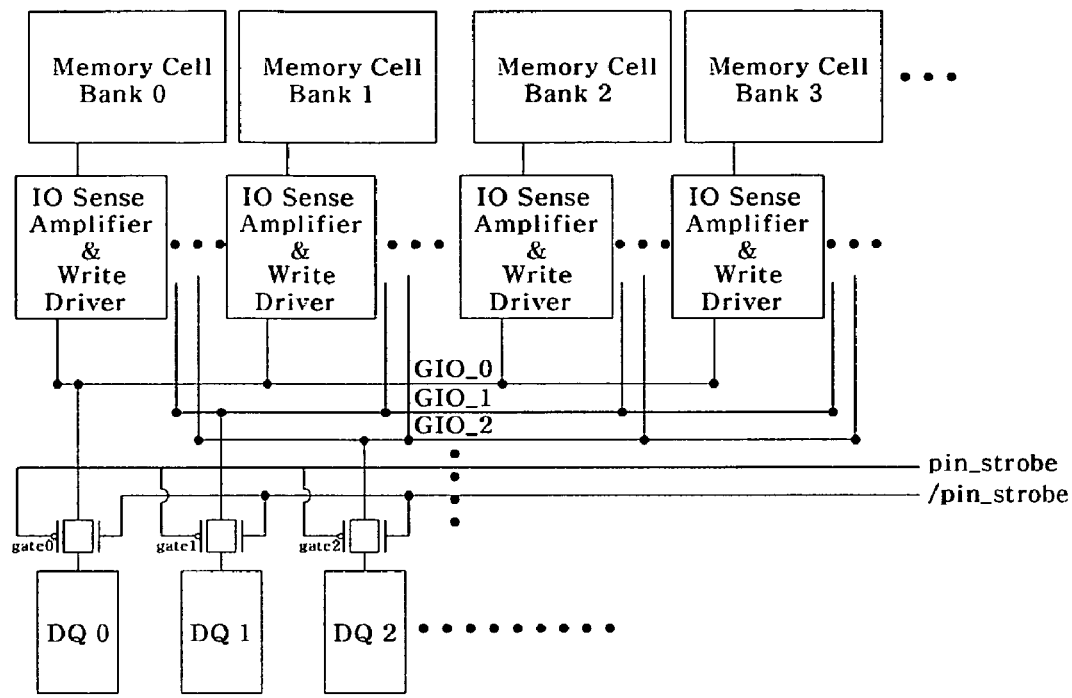
FIG. 1 shows a diagram illustrating a composition of a conventional memory device that input and outputs data through a global IO line.
Figure 2:
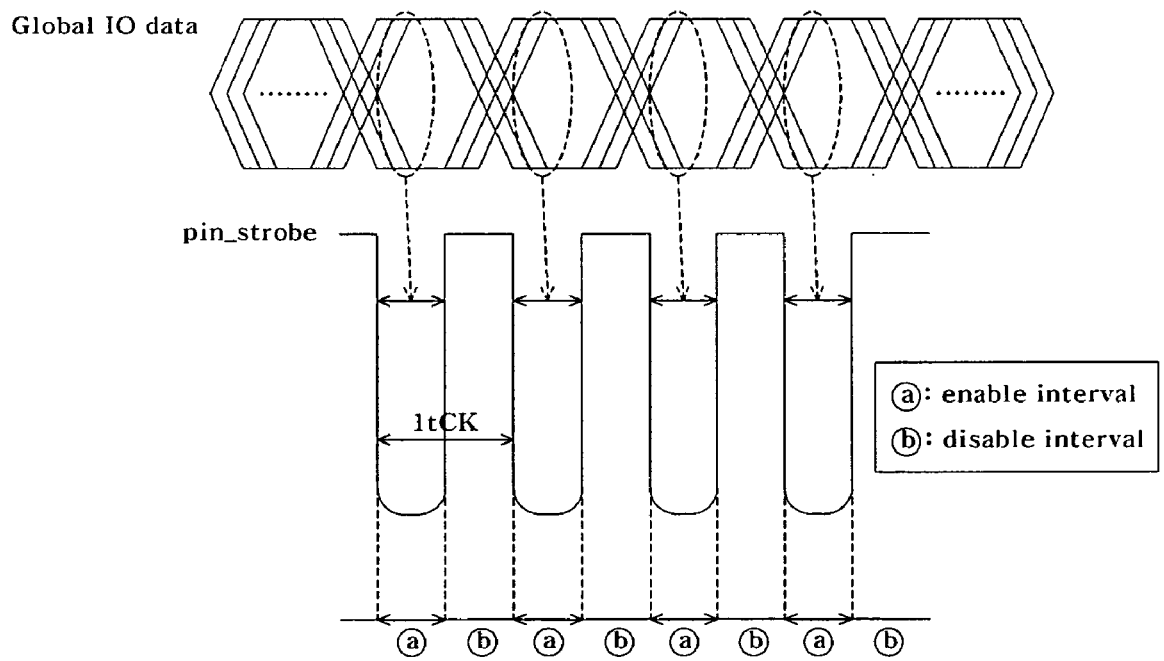
FIG. 2 presents a diagram showing a waveform of a data signal and an output strobe signal transmitted through the global IO line in the conventional memory device.
Figure 3:
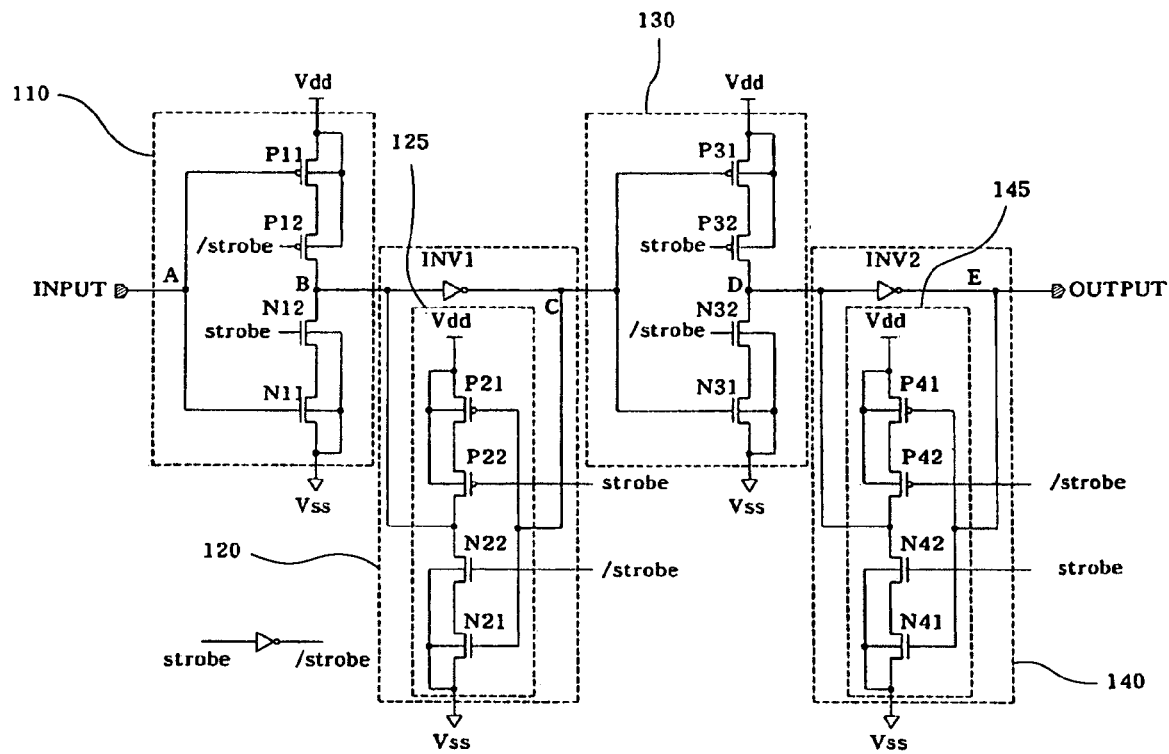
FIG. 3 provides a diagram depicting the composition of a data latch circuit in accordance with a preferred embodiment of the present invention.

FIG. 3 shows a structure of a data latch circuit in accordance with a preferred embodiment of the present invention. Referring to this drawing, the present invention will be described in detail below.

The data latch circuit in accordance with the preferred embodiment of the present invention comprises a first inverter 110 for performing a switching operation in response to a strobe signal strobe and buffering an input data signal INPUT, particularly inverting and outputting it, a first latch unit 120 for performing a switching operation by the strobe signal strobe and latching an output signal from the first inverter 110 for a preset time, a second inverter 130 for conducting a switching operation by the strobe signal strobe and buffering an output signal from the first latch unit 120, specifically inverting and outputting it, and a second latch unit 145 for carrying out a switching operation in response to the strobe signal strobe and latching an output signal from the second inverter 130.

The input data signal INPUT may be a data signal transmitted from a memory cell through a global IO line, or may be a data signal transmitted from an outside data input port through the global IO line.

The first inverter 110 includes a PMOS P11 for a pull-up function, an NMOS N11 for a pull-down function, a PMOS P12 for switching an operation of the PMOS P11 in response to the strobe signal strobe, and an NMOS N12 for switching operation of the NMOS N11 in response to the strobe signal strobe.

The first latch unit 120 includes a third inverter INV1 for inverting and outputting a signal from the first inverter 110, and a fourth inverter 125 for performing a switching operation in response to the strobe signal strobe and inverting a signal from an output port of the third inverter INV1 to create feedback of an inverted signal to an input port of the third inverter INV1. The fourth inverter 125 includes a PMOS P21 for a pull-up operation, an NMOS N21 for a pull-down operation, a PMOS P22 for switching an operation of the PMOS P21 in response to the strobe signal strobe, and an NMOS N22 for switching an operation of the NMOS N21 in response to the strobe signal strobe.

The second inverter 130 includes a PMOS P31 for a pull-up function, an NMOS N31 for a pull-down function, a PMOS P32 for switching an operation of the PMOS P31 in response to the strobe signal strobe, and an NMOS N32 for switching an operation of the NMOS N31 in response to the strobe signal strobe.

The second latch unit 140 includes a fifth inverter INV2 for inverting and outputting a signal from the second inverter 130, and a sixth inverter 145 for conducting a switching operation in response to the strobe signal strobe and inverting a signal from an output port of the fifth inverter INV2 to create feedback of an inverted signal to an input port of the fifth inverter INV2. The sixth inverter 145 includes a PMOS P41 for a pull-up operation, an NMOS N41 for a pull-down operation, a PMOS P42 for switching an operation of the PMOS P41 in response to the strobe signal strobe, and an NMOS N42 for switching an operation of the NMOS N41 in response to the strobe signal strobe.

Now, an operation of the data latch circuit of the present invention as structured above, will be described in detail below.

First of all, when the strobe signal strobe is high level, the switching elements, PMOS P12, NMOS N12, PMOS P42, and NMOS N42, are turned-on and thus, the first and the sixth inverters 110 and 145 are turned-on; and the switching elements, PMOS P22, NMOS N22, PMOS P32, and NMOS N32, are turned-off and thus, the second and the fourth inverters 130 and 125 are turned-off. Based on this, the first inverter 110 becomes a state that is capable of inputting the input data signal INPUT and the second latch unit 140 conducts a latch operation and maintains data just before the strobe signal strobe is changed to a high level. Herein, the input data signal INPUT may be a data signal transmitted from a memory cell through a global IO line, or may be a data signal transmitted from an outside data input port through the global IO line. The strobe signal strobe indicates a pin strobe signal pin_strobe or a write strobe signal wt_strobe, which is used for synchronization of the data transmission while reading data from the inside or writing it therein. Herein, a signal strobe is an inverter signal of the signal strobe.

At this time, if the strobe signal strobe is transited from a high level to a low level, the switching elements, PMOS P12, NMOS N12, PMOS P42, and NMOS N42, are turned-off and thus, the first and the sixth inverters 110 and 145 are turned-off; and the switching elements, PMOS P22, NMOS N22, PMOS P32, and NMOS N32, are turned-on and thus, the second and the fourth inverters 130 and 125 are turned-on. According to this, the first inverter 110 becomes a state that is incapable of inputting the input data signal INPUT and the first latch unit 120 conducts a latch operation and maintains data just before the strobe signal strobe is changed to low level. And, the second inverter 130 inverters a signal from the first latch unit 120 to output an inverted signal, and the fifth inverter INV2 again inverts an output from the second inverter 130 to provide an inverted signal as an output signal OUTPUT. Thus, the data latch circuit in accordance with the present invention first maintains the input data signal INPUT for which the strobe signal strobe is previously a high level, and then transmits the signal INPUT to the output port OUTPUT when the strobe signal strobe is transited from a high level to low level.

Meanwhile, if the strobe signal strobe is transited from a low level to a high level, then the first and the sixth inverters 110 and 145 are turned-on and thus, the second and the fourth 130 and 125 are turned-off. By this, the first inverter 110 becomes a state that is capable of inputting the input data signal INPUT and the first latch unit 120 stops the latch operation. And, the second inverter 130 is turned-off and stops the operation of inverting the signal from the first latch unit 120; and the second latch unit 140 conducts a latch operation and continues to maintain data just before the strobe signal strobe is changed to high level to provide it to the output port OUTPUT. Thus, if the strobe signal strobe is transited from low level to high level, the data latch circuit in accordance with the preferred embodiment of the present invention continues to output the data that has been transmitted to the output port OUTPUT when the strobe signal strobe is of the previously low level.

Figure 4:
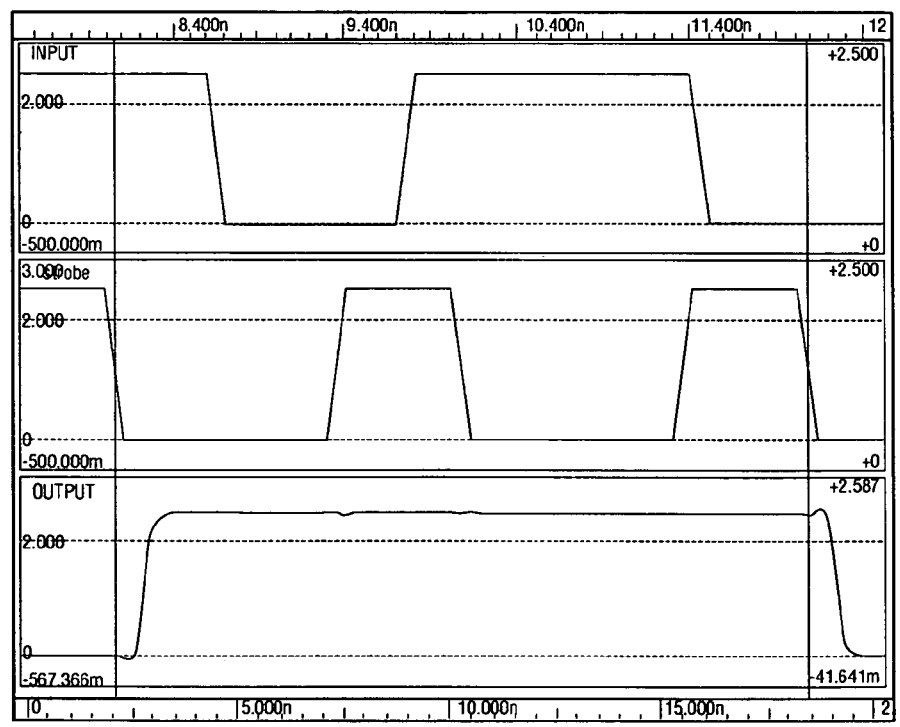
FIG. 4 is a waveform of the data input signal, the strobe signal and data output signal in the data latch circuit in accordance with the present invention.

In brief, as shown in FIG. 4, the data latch circuit in accordance with the preferred embodiment of the present invention receives and maintains the input data signal INPUT for a certain time when the strobe signal strobe is high level; and then transmits the same to the output port OUTPUT at the time when the strobe signal strobe is transited high level to low level. As can be seen from FIG. 4, in the data latch circuit in accordance with the preferred embodiment of the present invention, although one clock period is about 2 ns and the pulse width of the strobe signal when enabled is quite large, it is possible to conduct a normal data transmission process.

As mentioned above, the data latch circuit of the present invention can precisely transmit input data or output data by sensing the point of time when the strobe signal strobe is enabled although there occurs a level transition of cell data during the strobe signal being enabled according to an increase in the difference of the skew and flight time of the data that is transited every clock period, and by transmitting the data based thereon. Thus, the data latch circuit of the present invention is capable of improving the timing margin to latch output data in DQ block upon a read operation and a write operation margin to write the input data in a memory cell upon a write operation.

Figure 5:
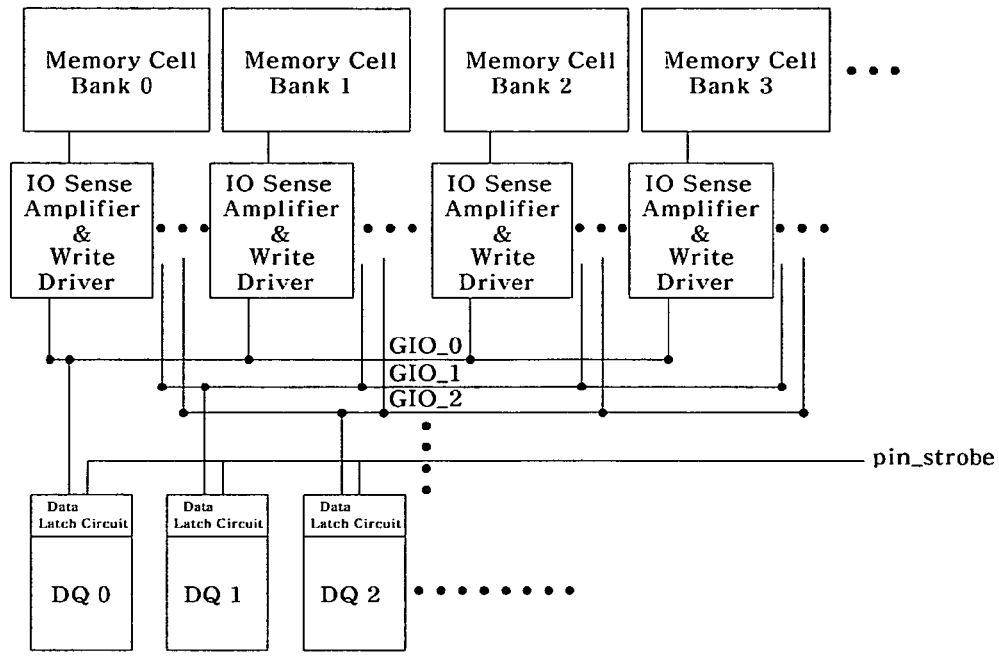
FIG. 5 depicts a diagram illustrating a configuration of a semiconductor device outputting data of a memory cell employing the data latch circuit in accordance with the present invention.

FIG. 5 shows a structure of the semiconductor device outputting data of a memory cell using the data latch circuit in accordance with the preferred embodiment of the present invention. Referring to this drawing, the semiconductor device in accordance with a first embodiment of the present invention will be described in detail below.

As shown, the semiconductor device in accordance with the first embodiment of the present invention comprises a plurality of memory cell banks Bank0, Bank1, . . . , with memory cells, a plurality of sense amplifiers for amplifying and outputting data signal from the memory cells, and data latch circuits for latching the data signal transmitted through global IO lines GIO_0, GIO_1, . . . , and outputting it to output ports DQ0, DQ1, . . . . Herein, a structure and an operation of each data latch circuit used in the semiconductor device are the same as those of the data latch in accordance with the preferred embodiment of the present invention.

Now, an operation of the semiconductor device in accordance with the first embodiment of the present invention will be described in detail below. First, upon a read operation, data stored in each memory cell of the memory cell banks Banks0, bank1, . . . , is amplified by an electric potential level by the IO sense amplifier, and then the amplified data is transmitted to a plurality of data latch circuits through the global IO lines GIO_0, GIO_1, . . . . And, the data inputted in the data latch circuits is provided to the data output ports DQ0, DQ1, . . . , according to a latch operation by those circuits. At this time, each data latch circuit precisely transmits cell data being outputted by sensing the point in time when the strobe signal strobe, particularly the pin strobe signal pin_strobe is enabled, as in the data latch circuit mentioned above, and transmitting the data based thereon.

Figure 6:
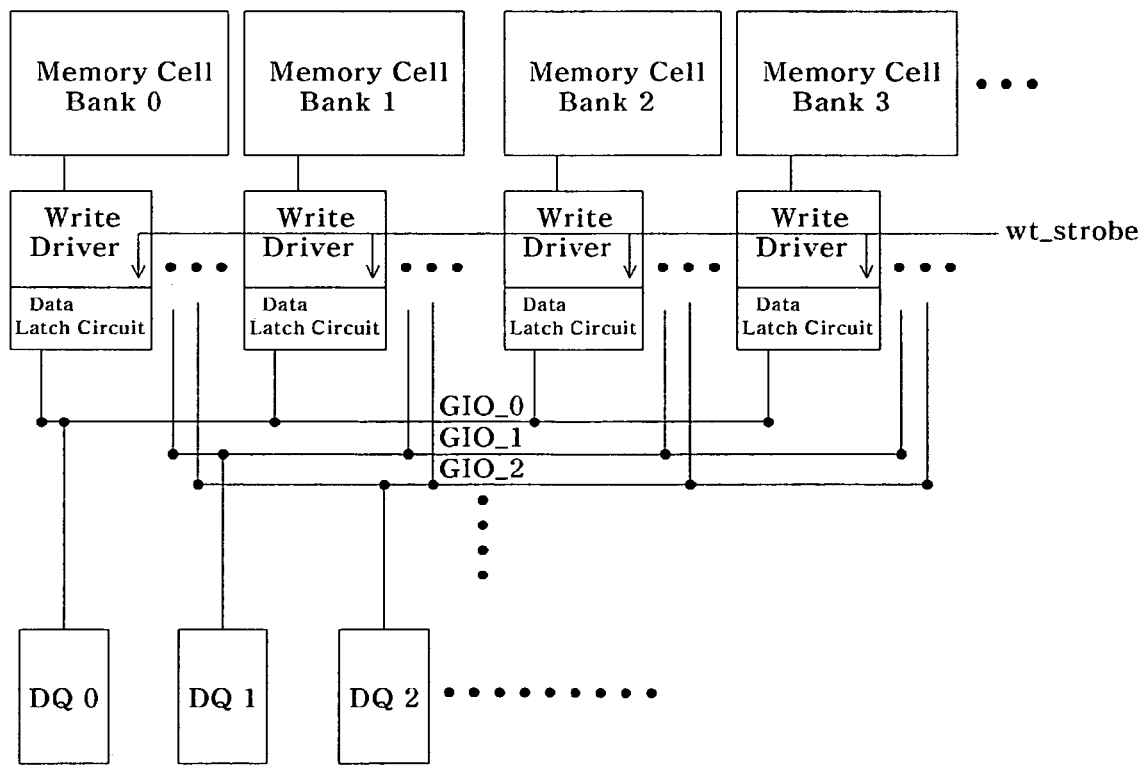
FIG. 6 illustrates a configuration diagram of a semiconductor device that writes external input data in the memory cell employing the data latch circuit in accordance with the present invention.

FIG. 6 shows a structure of the semiconductor device writing outside input data in a memory cell using the data latch circuit in accordance with the preferred embodiment of the present invention. Referring to this drawing, the semiconductor device in accordance with a second embodiment of the present invention will be described in detail below.

As shown, the semiconductor device in accordance with the second embodiment of the present invention comprises a plurality of cell banks Bank0, bank1, . . . , with memory cells, data latch circuits for latching and outputting data signal transmitted through global IO lines GIO_0, GIO_1, . . . , from outside input ports DQ0, DQ1, . . . , and write drivers for writing the data signal from the data latch circuits in each memory cell. Herein, a structure and an operation of each data latch circuit used in the semiconductor device are the same as those of the data latch circuit in accordance with the preferred embodiment of the present invention.

Now, an operation of the semiconductor device in accordance with the second embodiment of present invention will be described in detail below. First, upon a write operation, a data signal inputted to the data input ports DQ0, DQ1, . . . , is transmitted to a plurality of data latch circuits through the global IO lines GIO_0, GIO_1, . . . . And, the data inputted in the data latch circuits is outputted to the write drivers and stored in each memory cell of the memory cell banks Bank0, bank1, . . . , according to a latch operation by the data latch circuits. At this time, each data latch circuit precisely transmits cell data being inputted by sensing the point of time when the strobe signal strobe, particularly the write strobe signal wt_strobe is enabled, as in the data latch circuit mentioned above, and transmitting the data based thereon.

As discussed above, the data latch circuit of the present invention and the semiconductor device using the same can precisely transmit input data or output data by sensing the point of time when the strobe signal strobe is enabled and transmitting the data based thereon although there occurs a level transition of cell data during the time period the strobe signal strobe is enabled according to an increase in a difference of skew and flight time of data that is transited every one clock period. Thus, the data latch circuit of the present invention is capable of improving a timing margin to latch output data in the DQ blocks when data is inputted and outputted in and from the semiconductor device upon the read operation and a write operation margin to write input data in a memory cell upon a write operation.

As a result, the data latch circuit in accordance with the present invention can improve the timing margin to latch output data in the DQ blocks upon a data read operation and a write operation margin to write input data in a memory cell upon a data write operation, by solving a data input and output timing margin problem that arises due to an increase in the difference of the skew and flight times of data that is transited every clock period, when data is inputted and outputted in and from the semiconductor device.

While the present invention has been described with respect to the particular embodiments, it will be apparent to those skilled in the art that various changes and modifications may be made without departing from the spirit and scope of the invention as defined in the following claims.

What is claimed is:

1. A data latch circuit comprising:
    a first buffer for buffering an input data signal in synchronization with an input strobe signal;
    a first latch unit for performing a switching operation in response to the strobe signal and latching an output signal from the first buffer for a preset time;
    a second buffer for buffering an output signal from the first latch unit in synchronization with the strobe signal; and
    a second latch unit for performing a switching operation in response to the strobe signal and latching an output signal from the second buffer for a preset time.

2. The data latch circuit as set force in claim 1, wherein the first buffer is a first inverter for inverting the input data signal to output an inverted data signal and the second buffer is a second inverter for inverting an output signal from the first latch unit to provide an inverted data signal.

3. The data latch circuit as set force in claim 1, wherein the input data signal is a data signal transmitted from a memory cell through a global input and output line.

4. The data latch circuit as set force in claim 1, wherein the input data signal is a data signal transmitted from an outside data input port through a global input and output line.

5. The data latch circuit as set force in claim 1, wherein when the first buffer is in enable state by the strobe signal, the second latch unit is in enabled state and the first latch unit and the second buffer are in disabled state.

6. The data latch circuit as set force in claim 5, wherein when the first buffer is in disabled state by the strobe signal, the second latch unit is in disabled state and the first latch unit and the second buffer are in enabled state.

7. The data latch circuit as set force in claim 1, wherein the first buffer includes;
    a first pull-up element;
    a first pull-down element;
    a first switch for switching an operation of the first pull-up element in response to the strobe signal; and
    a second switch for switching an operation of the first pull-down element in response to the strobe signal.

8. The data latch circuit as set force in claim 1, wherein the first latch unit includes:
    a third inverter for inverting a signal from the first buffer to output an inverted signal; and
    a fourth inverter for conducting a switching operation in response to the strobe signal and inverting a signal from an output port of the third inverter to establish a feedback of the inverted signal to an input port of the third inverter.

9. The data latch circuit as set force in claim 8, wherein the fourth inverter includes;
a second pull-up element;
a second pull-down element;
a third switch for switching an operation of the second pull-up element in response to the strobe signal; and
a fourth switch for switching an operation of the second pull-down element in response to the strobe signal.

10. The data latch circuit as set force in claim 1, wherein the second buffer includes;
a third pull-up element;
a third pull-down element;
a fifth switch for switching an operation of the third pull-up element in response to the strobe signal; and
a sixth switch for switching an operation of the third pull-down element in response to the strobe signal.

11. The data latch device as set force in claim 1, wherein the second latch unit includes;
a fifth inverter for inverting a signal from the second buffer to provide an inverted signal; and
a sixth inverter for performing a switching operation in response to the strobe signal and inverting a signal from an output port of the fifth inverter to make a feedback of the inverted signal to an input port of the fifth inverter.

12. The data latch circuit as set force in claim 11, wherein the sixth inverter includes;
a fourth pull-up element;
a fourth pull-down element;
a seventh switch for switching an operation of the fourth pull-up element in response to the strobe signal; and
an eighth switch for switching an operation of the fourth pull-down element in response to the strobe signal.

13. A semiconductor device comprising:
a plurality of memory cell banks with memory cells;
a plurality of sense amplifier for amplifying data signal from the memory cells; and
a plurality of data latch circuits for latching the data signal transmitted through global input and output lines,
wherein each data latch circuit includes:
a first buffer for buffering the data signal in synchronization with an input strobe signal;
a first latch unit for carrying out a switching operation in response to the strobe signal and latching an output signal from the first buffer for a preset time;
a second buffer for buffering an output signal from the first latch unit in synchronization with the strobe signal; and
a second latch unit for conducting a switching operation in response to the strobe signal and latching an output signal from the second buffer.

14. The semiconductor device as set force in claim 13, wherein the first buffer is a first inverter for inverting the data signal to output an inverted data signal and the second buffer is a second inverter for inverting an output signal from the first latch unit to provide an inverted data signal.

15. The semiconductor device as set force in claim 13, wherein the first buffer includes;
a first pull-up element;
a first pull-down element;
a first switch for switching an operation of the first pull-up element in response to the strobe signal; and
a second switch for switching an operation of the first pull-down element in response to the strobe signal.

16. The semiconductor device as set force in claim 13, wherein the first latch unit includes;
a third inverter for inverting a signal from the first buffer to output an inverted signal; and
a fourth inverter for performing a switching operation in response to the strobe signal and inverting a signal from an output port of the third inverter to build up a feedback of the inverted signal to an input port of the third inverter.

17. The semiconductor device as set force in claim 16, wherein the fourth inverter includes;
a second pull-up element;
a second pull-down element;
a third switch for switching an operation of the second pull-up element in response to the strobe signal; and
a fourth switch for switching an operation of the second pull-down element in response to the strobe signal.

18. The semiconductor device as set force in claim 13, wherein the second buffer includes;
a third pull-up element;
a third pull-down element;
a fifth switch for switching an operation of the third pull-up element in response to the strobe signal; and
a sixth switch for switching an operation of the third pull-down element in response to the strobe signal.

19. The semiconductor device as set force in claim 13, wherein the second latch unit includes;
a fifth inverter for inverting a signal from the second buffer to provide an inverted signal; and
a sixth inverter for conducting a switching operation in response to the strobe signal and inverting a signal from an output port of the fifth inverter to establish a feedback of the inverted signal to an input port of the fifth inverter.

20. The semiconductor device as set force in claim 19, wherein the sixth inverter includes;
a fourth pull-up element;
a fourth pull-down element;
a seventh switch for switching an operation of the fourth pull-up element in response to the strobe signal; and
an eighth switch for switching an operation of the fourth pull-down element in response to the strobe signal.

21. A semiconductor device comprising:
a plurality of cell banks with memory cells;
a plurality of data latch circuits for latching data signal transmitted through global input and output lines from outside input ports; and
a plurality of write drivers for writing the data signal from the data latch circuits in each of the memory cells,
wherein each data latch circuit includes:
a first buffer for buffering the data signal in synchronization with an input strobe signal;
a first latch unit for performing a switching operation in response to the strobe signal and latching an output signal from the first buffer for a preset time;
a second buffer for buffering an output signal from the first latch unit in synchronization with the strobe signal; and
a second latch unit for conducting a switching operation in response to the strobe signal and latching an output signal from the second buffer for a preset time.

22. The semiconductor device as set force in claim 21, wherein the first buffer is a first inverter for inverting the data signal to provide an inverted signal and the second buffer is a second inverter for inverting an output signal from the first latch unit to output an inverted signal.

23. The semiconductor device as set force in claim 21, wherein the first buffer includes;
- a first pull-up element;
- a first pull-down element;
- a first switch for switching an operation of the first pull-up element in response to the strobe signal; and
- a second switch for switching an operation of the first pull-down element in response to the strobe signal.

24. The semiconductor device as set force in claim 21, wherein the first latch unit includes;
- a third inverter for inverting a signal from the first buffer; and
- a fourth inverter for performing a switching operation in response to the strobe signal and inverting a signal from an output port of the third inverter to make a feedback of an inverted signal to an input port of the third inverter.

25. The semiconductor device as set force in claim 24, wherein the fourth inverter includes;
- a second pull-up element;
- a second pull-down element;
- a third switch for switching an operation of the second pull-up element in response to the strobe signal; and
- a fourth switch for switching an operation of the second pull-down element in response to the strobe signal.

26. The semiconductor device as set force in claim 21, wherein the second buffer includes;
- a third pull-up element;
- a third pull-down element;
- a fifth switch for switching an operation of the third pull-up element in response to the strobe signal; and
- a sixth switch for switching an operation of the third pull-down element in response to the strobe signal.

27. The semiconductor device as set force in claim 21, wherein the second latch unit includes;
- a fifth inverter for inverting a signal from the second buffer; and
- a sixth inverter for performing a switching operation in response to the strobe signal and inverting a signal from an output port of the fifth inverter to form a feedback of an inverted signal to an input port of the fifth inverter.

28. The semiconductor device as set force in claim 27, wherein the sixth inverter includes;
- a fourth pull-up element;
- a fourth pull-down element;
- a seventh switch for switching an operation of the fourth pull-up element in response to the strobe signal; and
- an eighth switch for switching an operation of the fourth pull-down element in response to the strobe signal.

* * * * *